US006400221B2

(12) United States Patent
Brown, Sr.

(10) Patent No.: US 6,400,221 B2
(45) Date of Patent: Jun. 4, 2002

(54) AUDIO AMPLIFIER SYSTEM WITH DISCRETE DIGITAL FREQUENCY SELECTIVE DAMPING FACTOR CONTROLS

(75) Inventor: James W. Brown, Sr., Meridian, MS (US)

(73) Assignee: Peavey Electronics Corporation, Meridian, MS (US)

(*) Notice: Subject to any disclaimer, the term of this patent is extended or adjusted under 35 U.S.C. 154(b) by 0 days.

(21) Appl. No.: 09/874,976

(22) Filed: Jun. 7, 2001

Related U.S. Application Data

(60) Provisional application No. 60/214,769, filed on Jun. 29, 2000.

(51) Int. Cl.[7] .................................................. H03F 1/36
(52) U.S. Cl. .......................................... 330/86; 330/282
(58) Field of Search .......................... 330/86, 109, 282, 330/294; 381/121, 96, 98

(56) References Cited

U.S. PATENT DOCUMENTS 3,753,140 A 8/1973 Feistel
3,784,924 A 1/1974 Mansnerus
3,831,103 A 8/1974 Ruegg et al.
3,946,328 A 3/1976 Boctor
4,002,994 A 1/1977 Fender
4,012,704 A 3/1977 Rollett
4,034,308 A 7/1977 Wermuth et al.
4,092,494 A 5/1978 Micheron
4,099,134 A 7/1978 Schroder
4,107,622 A 8/1978 Toyomaki
4,151,477 A 4/1979 Yokoyama
4,220,817 A 9/1980 Kampmann
4,223,273 A 9/1980 Yokoyama
4,229,619 A 10/1980 Yakahashi et al.
5,197,102 A * 3/1993 Sondermeyer ............... 381/96
5,675,656 A 10/1997 Sondermeyer et al.
6,104,245 A * 8/2000 De Jong ..................... 330/282
6,147,558 A * 11/2000 Sculley ....................... 330/284
6,246,282 B1 * 6/2001 Oono et al. ................... 330/86

* cited by examiner

*Primary Examiner*—Robert Pascal
*Assistant Examiner*—Henry Choe
(74) *Attorney, Agent, or Firm*—Dykema Gossett PLLC

(57) ABSTRACT

An audio amplifier drives a load in the form of a sound producing loud speaker exhibiting a frequency variable impedance characteristic over a range of audio frequencies. Voltage and current feedback circuits respectively establish a minimum voltage feedback and a discrete feedback characteristic. A presence feedback circuit coupled to ground reduces feedback in discrete steps with increasing frequency above a selected level and a resonance feedback circuit coupled in parallel with the amplifier circuit coupled in parallel with the amplifier reduces voltage feedback in discrete steps with decreasing frequencies below a selected level. The controls are responsive to a digital interface for providing discrete settings.

15 Claims, 2 Drawing Sheets

AUDIO AMPLIFIER SYSTEM WITH DISCRETE DIGITAL FREQUENCY SELECTIVE DAMPING FACTOR CONTROLS

This application claims benefit of provisional apply. Ser. No. 60/214,769 filed Jun. 29, 2000.

BACKGROUND OF THE INVENTION

The invention relates to musical instrument audio power amplifiers for driving loud speakers. In particular, the invention relates to audio amplifiers for guitars and other musical instruments having discrete digital frequency selective damping factor controls for improving the sound emitted by loud speakers over a full range of audio inputs and particularly at low frequencies near system resonance.

SUMMARY OF THE INVENTION

The present invention provides independently variable discrete digital controlled frequency selective damping factor controls especially for guitar amplifiers which incorporate the frequency dependent speaker load into the control loop. The invention is applicable to all types of audio power amplifiers but is particularly useful in solid state audio power amplifiers which sometimes suffer from the inability to produce the necessary strong high and low outputs useful for effectively driving loud speakers in guitar applications.

In accordance with the invention, the output impedance of the amplifier is discretely reduced or adjusted in order to decrease the damping factor.

In a particular embodiment, the invention comprises a solid state audio power amplifier having an input, an output and independently discretely variable frequency selecting damping factor controls. The amplifier drives a load in a foam of a sound producing loud speaker which has a variable impedance characteristic in the audio frequency range. A voltage limit feedback circuit is coupled between the input and output of the amplifier for establishing a minimum level of voltage feedback as at all times. A load current feedback circuit is coupled between the load and the input for establishing a feedback characteristic representative of the load. A presence feedback circuit coupled in parallel with the voltage feedback circuit discretely reduces feedback with increasing frequency above a selected level whereby the damping factor of the amplifier is reduced. A resonance feedback circuit coupled in series with the voltage feedback circuit discretely reduces voltage feedback with decreasing frequencies below a selected level whereby the damping factor is accordingly reduced. The presence and resonance feedback circuits operate independently without interference, so that speaker performance is enhanced at the low and high ends without compromising one or the other. In particular, the amplifier is responsive to reduce the damping factor and to thereby variably and selectively increase the power to the load for enhancing the sound produced by the loud speaker at both high and low frequencies.

BRIEF DESCRIPTION OF THE DRAWINGS

Similar elements have the same reference numerals throughout the specification and drawings.

DETAILED DESCRIPTION OF THE INVENTION

Figure 1:
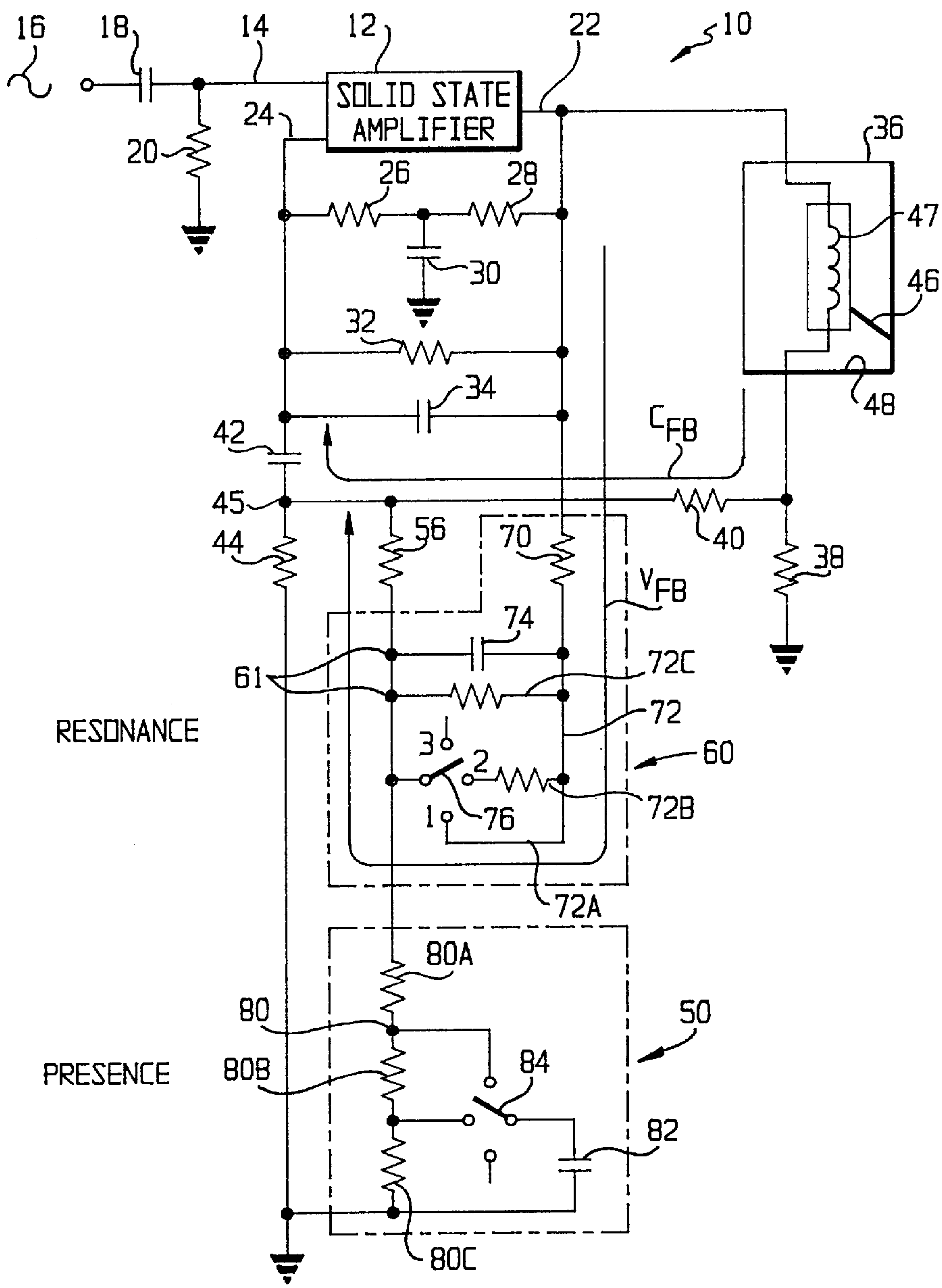
FIG. 1 is a schematic diagram illustrating a solid state amplifier employing frequency selective discrete damping factor controls according to the present invention.

FIG. 1 illustrates an audio power amplifier system 10 having frequency selecting damping factor controls according to the present invention. The amplifier 10 includes a solid state amplifier 12 having one or more stages (not shown) and having a non inverting or positive input 14 for receiving a variable frequency audio signal 16, such as a guitar input, through input capacitor 18. Input resistor 20 is coupled to the junction between the input 14 and the capacitor 18 for establishing a ground reference for the input signal.

The amplifier 12 has an output lead 22 and an inverting or negative input 24. A dc feedback path is established by a pair of series connected feedback resistors 26 and 28 coupled between the output 22 and the inverting input 24. A coupling capacitor 30 connected between the resistors 26 and 28 defeats AC feedback to the input over the loop. The resistors 26 and 28 provide overall DC feedback for the amplifier 10.

AC feedback resistor 32 is coupled between the output 22 and the inverting input 24 in parallel with the DC feedback resistors 26 and 28. A feedback capacitor 34 in shunt with the feedback resistor 32 provides circuit stability. The feedback resistor 32 has a relatively large value for providing at all times a minimum AC feedback to the amplifier input 24 in order to prevent an unacceptably high gain a low feedback levels.

A load impedance 36 is coupled to the output 22 of the amplifier 12, and a sampling resistor 38 is serially connected between the load impedance 36 and ground as shown. Current feedback resistor 40 is coupled to the node between load impedance 36 and the sampling resistor 38. The sampling resistor 38 is small compared to the load impedance 26 and provides a small voltage at the node therebetween which is fed back to the inverting input 24 of the amplifier through the current feedback resistor 40. An AC isolating capacitor 42 is serially connected between the current feedback resistor 40 and the inverting input 24 to block dc feedback.

A gain resistor 44 is connected between node 45 and ground to establish the amplifier gain characteristic in combination with the various feedback impedances which feed node 45. The value of the various resistances are selected to establish a nominal overall gain and feedback for the amplifier 12.

The load impedance 36 is represented by a speaker 46 having an inductive reactance represented by coil 47. The speaker 46 is located in an enclosure 48 which has a mechanical resonance which affects the speaker impedance. The speaker 46 and enclosure 48 may have different resonance points. Typically, however, the resonance points are preferably matched.

Feedback may be modified in two ways. First, current feedback may be reduced by eliminating current feedback provided by the sampling resistor 38. This is accomplished by increasing the loud speaker impedance by means of a variable series resistance (not shown) or by simply open circuiting the loud speaker circuit. Second, voltage feedback between the output 22 and the input 24 may be decreased by adding impedance to the AC feedback path.

In accordance with the present invention, the amplifier 10 includes respective independent discretely variable frequency selective respective presence and resonance damping factor controls hereinafter referred to as presence control 50 and resonance control 60. As used herein, the term "presence" generally refers to the rising impedance in the form of a peak or knee which occurs at high frequency and which is primarily an inductance dependent characteristic. Likewise, as used herein, the term "resonance" generally refers to the sharply rising impedance in the form of a peak or knee which occurs at low frequency and which is primarily dependent on electromechanical characteristics of the speaker 46 and its enclosure 48. The controls 50 and 60 are in the form of alternate feedback paths that are separately and discretely selectable to reduce voltage feedback to thereby lower the damping factor of the amplifier 10 which results in an increased output voltage of the amplifier 12 in the respective high and low ends. Power delivered to the load 36 is thus increased and the speakers produce more sound. The presence and resonance controls 50 and 60 are commonly coupled at node 61 via a series dividing resistor 56 to the negative input 24.

The resonance control 60 includes a relatively small feedback resistor 70 in series with parallel combination of a switchable resistance ladder 72 and a resonance capacitor 74. The ladder 72 includes three or more separate resistances. For example, a short circuit 72A, resistor 72B of intermediate value, and a relatively large resistor 72C. An analog switch 76 is used to select one of the three options as shown in the drawing. The switch 76 may be operated by a digital interface discussed hereinafter. The resistors 72A, 72B, 72C establish different preset tones, and the amplifier responds with an appropriate damping factor selection to create the appropriate sound.

The presence control 50 includes the parallel combination of voltage divider 80 and capacitor 82 coupled to a switch 84. The presence divider ladder 80 comprises series resistors 80A, 80B and 80C. Additional resistors may be added as desired. A second analog switch 84 is used to connect the capacitor 82 to the nodes between the series connected resistors or not connected all. This simulates three settings, e.g., off and two higher settings. A digital interface may likewise be used to operate the settings as discussed hereinafter.

The presence control 50 operates as follows: when the switch 84 is set to the number 1 position, the capacitor 82 is open and offers nothing to the circuitry. That is, the ladder 80 is not shunted by the impedance of the capacitor 82. Thus, feedback from the output 12, which is divided at node 61, is applied to the input 24 as shown. However, when the ladder 80 is set to either of the discrete positions 2 or 3, the capacitor 82 is connected into the voltage feedback path VFB at node 61. This reduces the voltage feedback at high frequency by effectively grounding the node 61, thereby reducing the damping factor at those fiequencies. Intermediate settings of the divider 80 offer preset discrete amounts of damping factor reduction. Thus, the adjustment of the divider 80 results in a reduction of the damping factor to provide high frequency power to the load or loud speaker and thus the guitar player gets a pleasing edge-type sound.

The resonance control 60 which enhances the resonant sound of the associated loud speaker and its enclosure operates as follows: when the ladder 72, in series with the resonance feedback resistor 70 is set to position 1, the capacitor 74 is shunted by a short circuit represented by the line 72A having an effective resistance of zero, and therefore it offers nothing to the circuit. That is, the resistance of the feedback path through the resistor 70 is low compared to the resistance through resistor 32. However, when the ladder is set to position 3, it adds the relatively large value of resistance 72C in series with resistor 70. This additional resistance greatly reduces the voltage feedback and, hence, the damping factor of the amplifier to values below 0.1. The switch 76 may be positioned at discrete position 2 to provide an intermediate value of feedback. It should be understood that additional resistors may be added to provide finer selection.

It is important to note that the resonance capacitor 74 has a low value, e.g., 0.047 $\mu$f across the ladder 72. The function of the resonance capacitor 74 is to increase the damping factor value with increasing frequency. At low frequency, the capacitor 74 has little effect. However, as the frequency increases, the resonance capacitor 74 provides a current path around the resonance ladder 72 thereby reducing its effective impedance. Its value is chosen so that its impedance value will effectively short out the ladder 72 at mid band frequencies and above, e.g., above about 400 Hz. The resonance circuit 60 therefore causes reduction in the damping factor at very low frequencies below the mid range and thereby boosts low frequency power to the load 36 at or near the resonance frequency of the speaker 46 and its enclosure 48. This will boost the sound pressure level of the speaker in the low frequency range.

The resonance control 60 of the invention does not interfere with the presence control 50. The two circuits in combination then have selected frequency ranges of operation which are independent and do not compromise the effectiveness of each other, which is an important feature of the invention.

Figure 2:
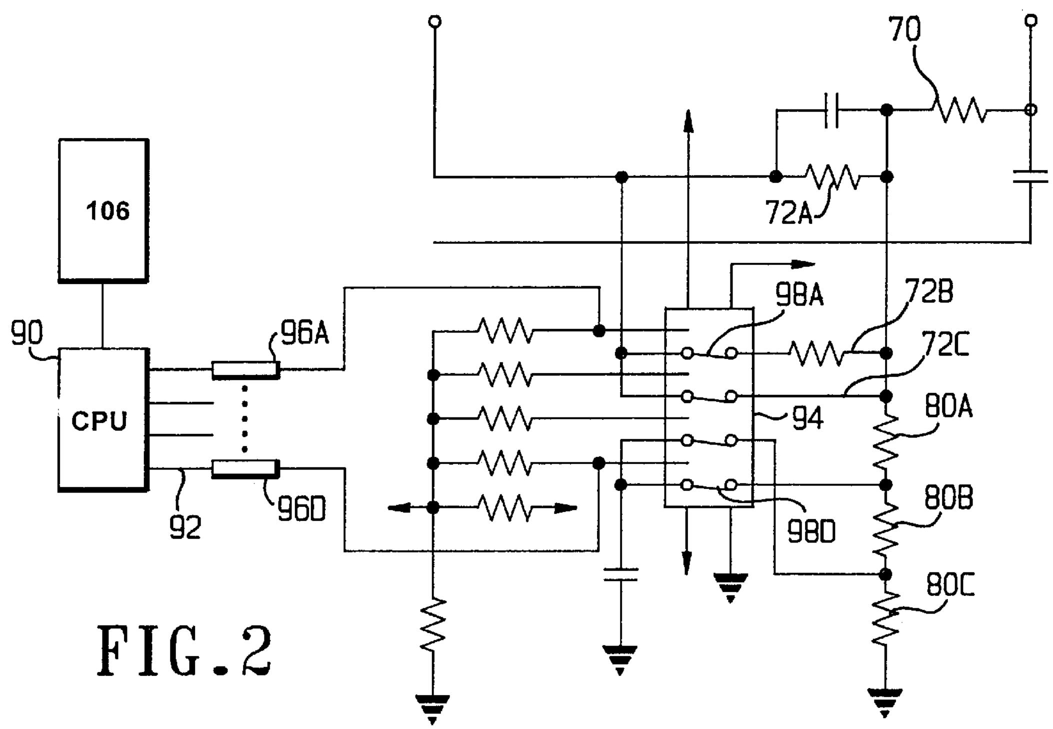
FIG. 2 is a schematic diagram illustrating the use of a CPU and a digital interface having a voltage limited connection for controlling an audio amplifier according to the invention.

FIG. 2 illustrates an arrangement employing a microprocessor or CPU 90 which has outputs 92A–92D for driving an analog switch 94 through respective latches 96A–96D. The switch 94 is connected in such a way that the voltage it sees is limited. The analog switch 94 may be, for example, a DG211 which is an integrated circuit having a plurality of solid state switches 98A–98D which may be selectively operated to open and closed positions by the CPU 90 through the respective latches 96A–96D, as shown. In the particular arrangement shown, latches 96A and 96B, driven by CPU 90, operate corresponding switches 98A and 98B in analog switch 94 to control resonance circuit 60. Similarly, latches 96C and 96D, driven by CPU 90, control switches 98C and 98D, which in tur, control presence circuit 50. Alternatively, the analog switch 94 may be selectable field effect transistors or relays (not shown) having a driver or latch input governed by the CPU output, or the analog switch may be a digital potentiometer.

Figure 3:
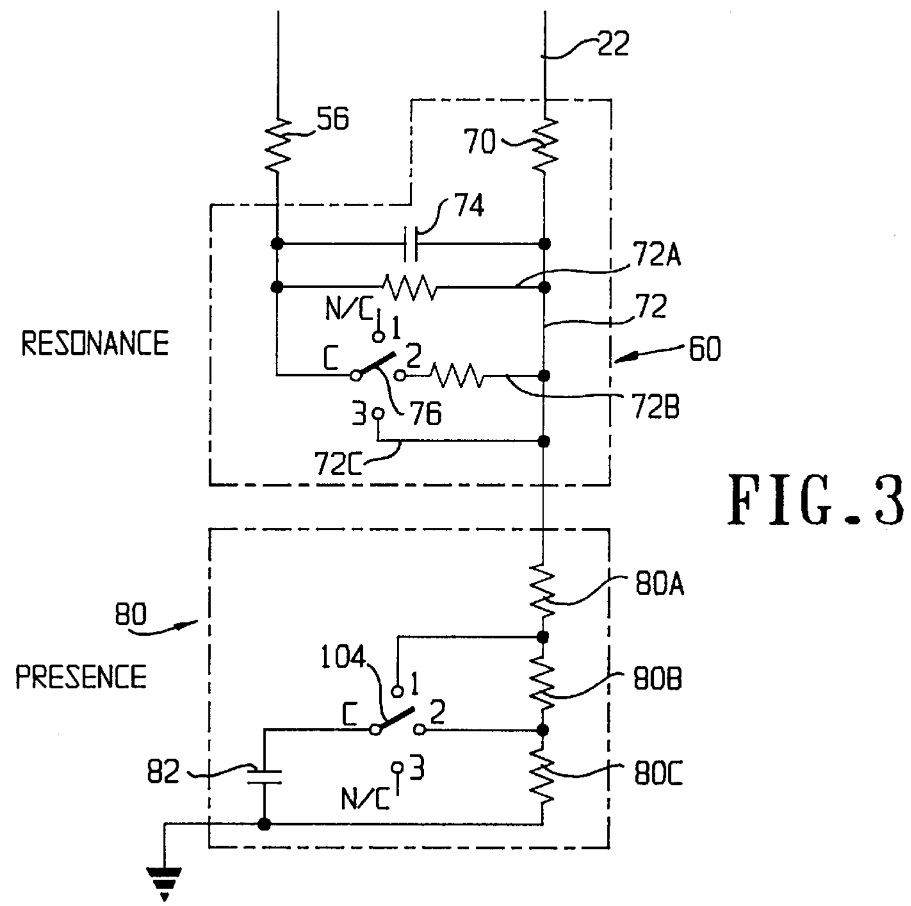
FIG. 3 illustrates the voltage limited switch connection of the arrangement of FIG. 2.

FIG. 3 illustrates an alternative exemplary embodiment of the invention employing a voltage limited switch connection for the analog switch. In the arrangement illustrated, the connection of the presence circuit 50 to the resonance circuit at node 61 has been moved to the side of the feedback block 60 coupled to the amplifier output 22 at node 101. The signal is reduced by the voltage divider between the resistance 70 and the series connected divider resistors 80A–80C. In particular, the resulting signal that the analog switch 76 sees is reduced. This arrangement is desirable in those situations where. the switches 76 and 84 can only tolerate low voltages, for example, a +/−15 volt swing. This arrangement operates essentially in the same way as the previously described arrangement because at high fiequencies, where the presence control 50 operates, the capacitor 74 is a short circuit. Thus, electrically the arrangement resembles FIG. 1 and it does not matter on which side of the capacitor 74 the feedback block resides. The resonance circuit 60 works similarly to the arrangement of FIG. 1. However, in order to maintain the same gain structure, the resistor 56 is reduced to a lower value. In the arrangement of FIG. 3, the analog switch 94 of FIG. 2 including separate or discrete switches 96 may be employed. The switches 96A–98D are individually coupled in series with the various resistors as shown. Depending on the desired tonal characteristics, the switches are selectively operated by the CPU 90.

The CPU 90 may be programmed in a known manner to selectively actuate the analog switch 94. Selective control may be achieved by means of a manual selector switch 106 having a number of program positions P1–Pn located on the amplifier. The switch 106 may be manually operated by the artist to control the CPU 90 to thereby select the type of sound desired depending on the program position selected.

While there has been described what are present or considered to be the exemplary embodiments of the invention, it will be apparent to those skilled in the art that various changes and modifications may be made therein and it is intended in the appended claims to cover such modifications as come within the true spirit and scope of the invention.

I claim:

1. A power amplifier having a frequency selective variable damping factor, said amplifier having an input, an output and a feedback circuit coupled therebetweern, the amplifier for driving a load in the feedback circuit having an impedance which varies with frequency between a high frequency cut-off and a low frequency resonance about a selected frequency comprising:

current feedback means in the feedback circuit;

first discrete variable impedance means in the feedback circuit to ground for varying overall feedback to the amplifier input as the frequency increases above the selected frequency to vary the response of the amplifier in discrete steps at high frequency; and second discrete tamable impedance means in the feedback circuit between the input and the output for Varying overall feedback to the amplifier input as the frequency decreases below the selected frequency to vary the response of the amplifier in discrete steps at low frequency, said first and second variable impedance means being independently operative with respect, to each other to selectively reduce feedback delivered to the load in said feedback circuit in discrete increments in accordance with its respective impedance and said current feedback means being operative to selectively increase power delivered to the load with changing frequency above and below said selected frequency at the load resonance and the high frequency cut-off.

2. The power amplifier of claim 1 further including output feedback means coupled between the load and the input, said load feedback means decreasing with load impedance.

3. The power amplifier of claim 1 further including load feedback means coupled between the load and the input, said load feedback means decreasing with load impedance.

4. The power amplifier of claim 1 wherein the amplifier is an audio amplifier and the load is a loud speaker.

5. The power amplifier of claim 1 wherein the amplifier is an audio amplifier for a guitar.

6. The power amplifier of claim 4 wherein the speaker has a characteristic frequency responsive impedance and the first and second variable impedance means are variable in discrete steps to enhance the sound emitted by the speaker.

7. The power amplifier of claim 1 wherein the load has a nominal impedance at about 400 Hz, the impedance of the load increases from said nominal impedance above 400 Hz to about 20,000 Hz and from below 400 Hz to about 20 Hz.

8. The power amplifier of claim 1 wherein the amplifier operates over a range of frequencies and further includes impedance means in parallel with each of the first and second variable impedance means for establishing a maximum gain factor for the amplifier over said range of frequencies.

9. The power amplifier of claim 1 further including voltage feedback means between the input and output, said first variable impedance means for coupling the voltage feedback means to ground and the second variable impedance means for coupling the output to the input.

10. The power amplifier of claim 1, wherein the amplifier is a solid state device.

11. The power amplifier of claim 1, further including a central processing unit for controlling the first and second discrete variable impedance means.

12. The power amplifier of claim 11 wherein the first and second variable feedback means includes an analog switch responsive to the CPU.

13. The power amplifier of claim 12 wherein the analog switch comprises at least one of an integrated circuit, a solid state device, a field effect transistor, a relay and a digital potentiometer.

14. The power amplifier of claim 1, wherein the first variable impedance means includes a switchable resistance ladder.

15. The power amplifier of claim 1 wherein the second variable impedance means including a capacitor and a switchable voltage divider in parallel with said divider.

* * * * *